United States Patent
Lin

(10) Patent No.: US 9,310,776 B1
(45) Date of Patent: Apr. 12, 2016

(54) HIGH-SPEED ANALOG-TO-DIGITAL CONVERTER AND METHOD

(71) Applicant: Realtek Semiconductor Corp., Hsinchu (TW)

(72) Inventor: Chia-Liang (Leon) Lin, Fremont, CA (US)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 0 days.

(21) Appl. No.: 14/842,869

(22) Filed: Sep. 2, 2015

(51) Int. Cl.
*H03M 1/50* (2006.01)
*G04F 10/00* (2006.01)
*H03M 1/12* (2006.01)

(52) U.S. Cl.
CPC .............. *G04F 10/005* (2013.01); *G04F 10/00* (2013.01); *H03M 1/12* (2013.01)

(58) Field of Classification Search
CPC ......... G04F 10/005; G04F 10/00; H03M 1/12
USPC .................................................. 341/166, 155
See application file for complete search history.

(56) References Cited

U.S. PATENT DOCUMENTS

| | | | |
|---|---|---|---|
| 7,888,973 B1* | 2/2011 | Rezzi ...................... | H03L 7/085 327/105 |
| 8,193,963 B2* | 6/2012 | Wang .................... | G04F 10/005 324/76.53 |
| 9,209,820 B2* | 12/2015 | Familia ................... | H03L 7/097 |

* cited by examiner

*Primary Examiner* — Brian Young
(74) *Attorney, Agent, or Firm* — McClure, Qualey & Rodack, LLP

(57) ABSTRACT

A circuit having an input comparator configured to receive an input voltage and output an input dependent polarity signal along with an input dependent timing signal; a reference comparator configured to receive a reference voltage and output a reference dependent polarity signal along with a reference dependent timing signal; a time-to-digital converter configured to receive the input dependent timing signal and the reference dependent timing signal and output a digital signal; and an output encoder configured to receive the input dependent polarity signal and the digital signal and output an output data representing an analog-to-digital conversion of the input voltage.

20 Claims, 4 Drawing Sheets

HIGH-SPEED ANALOG-TO-DIGITAL CONVERTER AND METHOD

BACKGROUND OF THE INVENTION

1. Field of the Invention

The present invention generally relates to analog-to-digital conversion and more particularly to an analog-to-digital conversion circuit and related method.

2. Description of Related Art

Persons of ordinary skill in the art understand terms and basic concepts related to microelectronics that are used in this disclosure, such as "analog," "digital," "voltage," "current." "signal," "logical signal," "clock," "transistor," "PMOS (p-channel metal oxide semiconductor)," "NMOS (n-channel metal oxide semiconductor)," "source," "gate," "drain," "circuit node," "comparator," "amplifier," "latch," "inverter," "NAND gate," "flip-flop," "resistor," "current source," "common-mode," and "differential circuit." Terms and basic concepts like these are understood to those of ordinary skill in the art and thus need not be explained in detail here.

Through this disclosure, reference to a logical signal refers to a signal of two states: "high" and "low," which can also be re-phrased as "1" and "0." For brevity, a logical signal in the "high" ("low") state is simply stated as the logical signal is "high" ("low"), or alternatively, the logical signal is "1" ("0"). Also, for brevity, quotation marks may be omitted and the immediately above is simply stated as the logical signal is high (low), or alternatively, the logical signal is 1 (0), with the understanding that the statement is made in the context of describing a state of the logical signal.

A logical signal is said to be asserted when it is high. A logical signal is said to be de-asserted when it is low.

A clock signal is a cyclic logical signal. For brevity, hereafter, "clock signal" may be simply referred to as "clock."

As is known, an analog-to-digital converter (ADC) receives an analog signal and output a digital signal to represent a value of a sample of the analog signal in accordance with a sampling rate defined by a clock signal. An ADC converter is said to have a high speed if the sampling rate is high. For instance, an ADC of sampling rate of 500 Ms/s (mega-samples per second) may be said to have a high speed. The digital signal output from an ADC is a multi-level signal comprising a certain number of levels. The number of levels determines a resolution of the ADC: the more levels, the higher resolution. For instance, an ADC outputting an 8-level digital signal may be considered a low-resolution ADC. An 8-level signal can be represented by a 3-bit word using a binary code, or a 7-bit word using a thermometer code. Binary code and thermometer code are well known to those of ordinary skill in the art and thus not described in detail here.

A high-speed low-resolution ADC usually employs a flash ADC architecture comprising a plurality of comparators and outputting a digital code of a certain number of bits determined by a resolution of the ADC. For instance, a 8-level flash ADC receives an analog signal and periodically compares the analog signal with 7 reference voltages in accordance with a clock signal, resulting in a digital signal comprising a 7-bit thermometer code representing a value of the analog signal. The 7 reference voltages are equally spaced in levels, wherein a difference between two neighboring levels determines a level of a LSB (least-significant bit) of the ADC. Flash ADC is well known to those of ordinary skill in the art and thus not described in detail here.

One drawback of a flash ADC is that it requires L-1 comparators for outputting a L-level digital signal, and therefore the hardware cost may be too high when L is large. Another drawback of a flash ADC is that the analog signal needs to be compared with L-1 reference voltages, and therefore the loading to the source device that outputs the analog signal may be too heavy when L is large.

What is desired is an ADC that requires fewer comparators and does not require the analog signal to be compared with a large number of reference voltages.

BRIEF SUMMARY OF THIS INVENTION

In one embodiment, a circuit comprises: an input comparator configured to receive an input voltage and output an input dependent polarity signal along with an input dependent timing signal; a reference comparator configured to receive a reference voltage and output a reference dependent polarity signal along with a reference dependent timing signal; a time-to-digital converter configured to receive the input dependent timing signal and the reference dependent timing signal and output a digital signal; and an output encoder configured to receive the input dependent polarity signal and the digital signal and output an output data representing an analog-to-digital conversion of the input voltage. The input comparator detects a polarity of the input voltage and asserts the input dependent timing signal when the detection of the polarity of the input voltage is finished, while the reference comparator detects a polarity of the reference voltage and asserts the reference dependent timing signal when the detection of the polarity of the reference voltage is finished. The time-to-digital converter converts a difference between the input dependent timing and the reference dependent timing into a digital signal.

In an embodiment, a circuit comprises: a comparator array comprising a first comparator configured to receive an input voltage and output a first polarity signal indicating a polarity of the input voltage along with a first ready signal indicating the first polarity signal is ready in accordance with a timing of a clock signal, and a second comparator configured to receive a first reference voltage and output a second polarity signal indicating a polarity of the first reference voltage along with a second ready signal indicating the second polarity signal is ready in accordance with the timing of the clock signal; a time-to-digital converter configured to receive the first ready signal and the second ready signal and output a digital signal indicating a relative timing between the first ready signal and the second ready signal; and an output encoder configured to receive the first polarity signal and the digital signal and output an output data representing an analog-to-digital conversion of the input voltage. In a embodiment, the comparator array further comprises a third comparator configured to receive a second reference voltage and output a third polarity signal indicating a polarity of the second reference voltage along with a third ready signal indicating the third polarity signal is ready in accordance with the timing of the clock signal, and the time-to-digital converter is configured to further receive the third ready signal and the digital signal further indicates a relative timing between the first ready signal and the third ready signal. In an embodiment, the time-to-digital converter comprises a first flip-flop circuit configured to detect a relative timing of the first ready signal with respect to the second ready signal. In an embodiment, the time-to-digital converter further comprises a second flip-flop circuit configured to detect a relative timing of the first ready signal with respect to the third ready signal. In an embodiment, the first reference voltage is established by using a resistive ladder. In an embodiment, the first reference voltage and the second reference voltage are both established by using a resistive ladder. In an embodiment, a common-mode value of the input voltage is the same as a common-mode value of the first reference voltage and also the same as a common-mode value of the second reference voltage. In an embodiment, a magnitude of the second reference voltage is twice as large as a magnitude of the first reference voltage.

In an embodiment, a circuit comprises: an input comparator configured to receive an input voltage and output an input-dependent polarity signal along with an input-dependent ready signal; N reference comparators configured to receive N reference voltages and output N reference-dependent polarity signals along with N reference-dependent ready signals, respectively, wherein N is an integer greater than one; a time-to-digital converter configured to receive the input-dependent ready signal and the N reference-dependent ready signals and output a digital signal quantifying a relative timing of the input-dependent ready signal with respect to the N reference-dependent ready signals; and an output encoder configured to receive the input-dependent polarity signal and the digital signal and output an output data representing a result of analog-to-digital conversion of the input voltage, wherein: the input-dependent ready signal is asserted when the input comparator finishes a detection of a polarity of the input voltage, and each of the N reference-dependent ready signal is asserted when a respective reference comparator finishes a detection of a polarity of a respective reference voltage. In an embodiment, the input comparator and the N reference comparators are constructed by substantially identical circuits. In an embodiment, the input voltage and the N reference voltages all have the same common-mode value. In an embodiment, the time-to-digital converters comprises N flip-flop circuits configured to detect a relative timing between the input-dependent ready signal and the N reference-dependent ready signals, respectively. In an embodiment, the digital signal comprises N logical signals output from the N flip-flop circuits, respectively. In an embodiment, the N reference voltages are uniformly spaced in levels. In an embodiment, the N reference voltages are established using a resistive ladder.

In an embodiment, a method comprises: receiving an input voltage and a plurality of reference voltages comprising at least a first reference voltage and a second reference voltage; concurrently detecting the input voltage using an input comparator and detecting said plurality of reference voltages using a plurality of reference comparators comprising at least a first reference comparator and a second reference comparator, respectively, wherein the first input comparator outputs an input-dependent timing signal and said plurality of reference comparators output a plurality of reference-dependent timing signals comprising at least a first reference-dependent timing signal and a second reference-dependent timing signal, respectively; conducting a time-to-digital conversion to detect a relative timing between the input-dependent timing signal and said plurality of reference-dependent timing signals; determining a polarity of the input voltage based on a result of detecting the input voltage; and determining a range of the input voltage based on a result of the time-to-digital conversion. In an embodiment, the input comparator detects a polarity of the input voltage and asserts the input-dependent timing signal upon a time when the polarity of the input voltage is resolved, the first reference comparator detects a polarity of the first reference voltage and asserts the first reference-dependent timing signal upon a time when the polarity of the first reference voltage is resolved, the second reference comparator detects a polarity of the second reference voltage and asserts the second reference-dependent timing signal upon a time when the polarity of the second reference voltage is resolved. In an embodiment, the input comparator and said plurality of reference comparators are constructed by substantially identical circuits. In an embodiment, the input voltage and said plurality of reference voltages all have the same common-mode value. In an embodiment, said plurality of reference voltages are established using a resistive ladder. In an embodiment, conducting a time-to-digital conversion comprises using a plurality of flip-flop circuits configured to detect a relative timing between the input-dependent timing signal and said plurality of reference-dependent timing signals, respectively.

DETAILED DESCRIPTION OF THIS INVENTION

The present invention relates to analog-to-digital conversion. While the specification describes several example embodiments of the invention considered favorable modes of practicing the invention, it should be understood that the invention can be implemented in many ways and is not limited to the particular examples described below or to the particular manner in which any features of such examples are implemented. In other instances, well-known details are not shown or described to avoid obscuring or diluting aspects of the invention.

Figure 1:
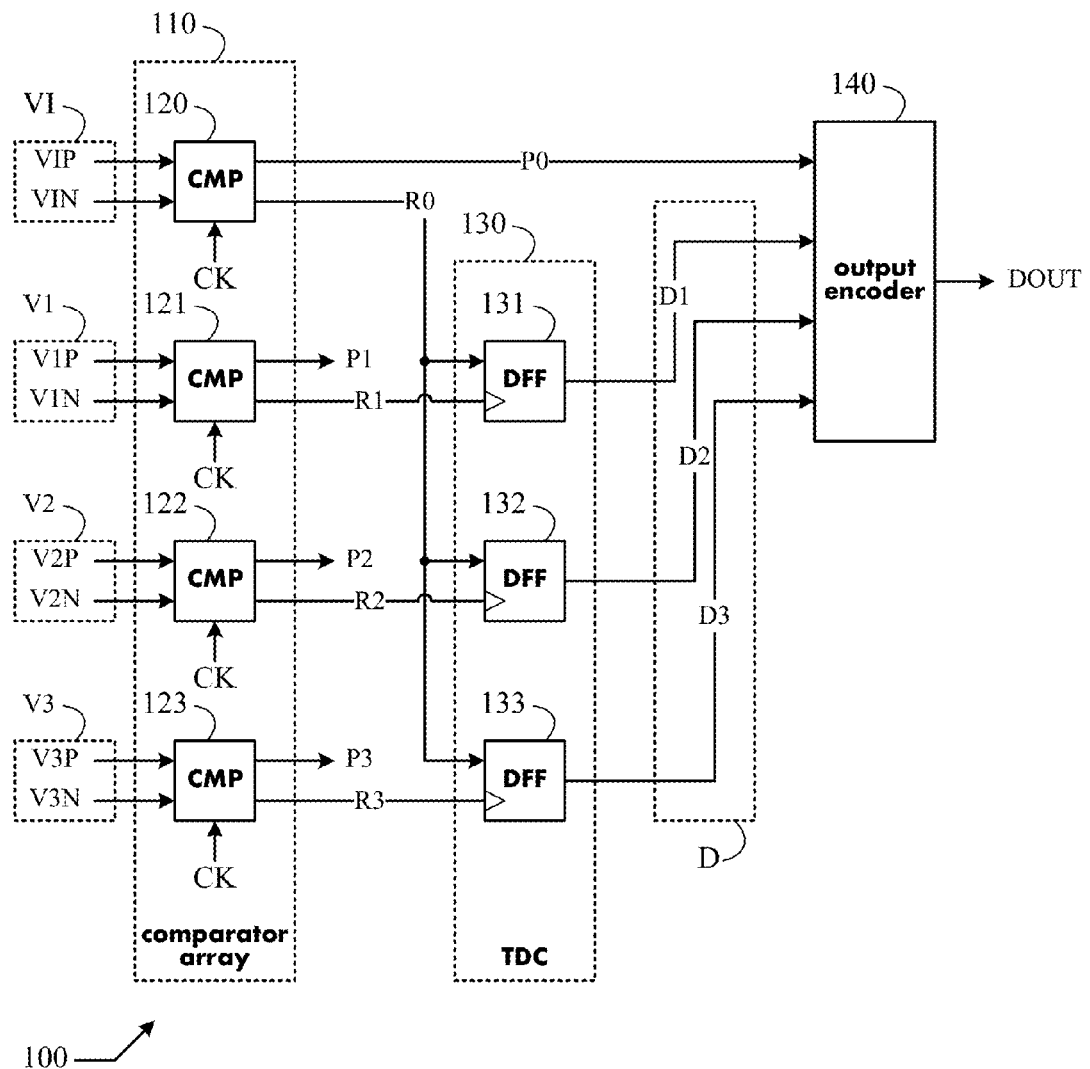
FIG. 1 shows a schematic diagram of an analog-to-digital converter in accordance with an embodiment of the present invention.

FIG. 1 shows a functional block diagram of an ADC (analog-to-digital converter) 100 in accordance with an embodiment of the present invention. ADC 100 receives an input voltage VI (which in differential circuit embodiment comprises a first end VIP and a second end VIN). Besides, ADC 100 also receives a plurality of reference voltages, which by way of example but not limitation include a first reference voltage V1 (which in differential circuit embodiment comprises a first end V1P and a second end V1N), a second reference voltage V2 (which in differential circuit embodiment comprises a first end V2P and a second end V2N), and a third reference voltage V3 (which in differential circuit embodiment comprises a first end V3P and a second end V3N). ADC 100 comprises: a comparator array 110, a TDC (time-to-digital converter) 130, and an output encoder 140. By way of example but not limitation, the comparator array 110 comprises a first (second, third, fourth) comparator (denoted as CMP in FIG. 1) 120 (121, 122, 123) configured to detect a polarity for VI (V1, V2, V3) in accordance with a timing of a clock signal CK. The first (second, third, fourth) comparator 120 (121, 122, 123) outputs a first (second, third, fourth) polarity signal P0 (P1, P2, P3) along with a first (second, third, fourth) ready signal R0 (R1, R2, R3). The TDC 130 receives the four ready signals R0, R1, R2, and R3 and outputs a digital signal D. By way of example but not limitation, the TDC 130 comprises a first (second, third) DFF (which stands for data flip-flop) 131 (132, 133), and the digital signal D comprises a first (second, third) intermediate logical signal D1 (D2, D3). The output encoder 140 receives the digital signal D and outputs the output data DOUT. The first, second, third, and fourth comparators 120, 121, 122, and 123 are substantially identical circuits. Each of said comparators receives a respective voltage signal (i.e., VI, V1, V2, V3) and outputs a respective polarity signal (i.e., P0, P1, P2, P3) along with a respective ready signal (i.e., R0, R1, R2, R3) in accordance with the timing of the clock signal CK. The respective polarity signal is a logical signal indicating a polarity of the respective voltage signal, while the respective ready signal is a logical signal indicating the respective polarity signal is ready. For instance, when R0 is 0, P0 is not ready yet. When R0 is 1 and P0 is 1 (0), it indicates P0 is ready and VI is positive (negative), i.e., VIP is higher (lower) than VIN. A principle of the present invention is described in the following paragraphs.

Figure 2:
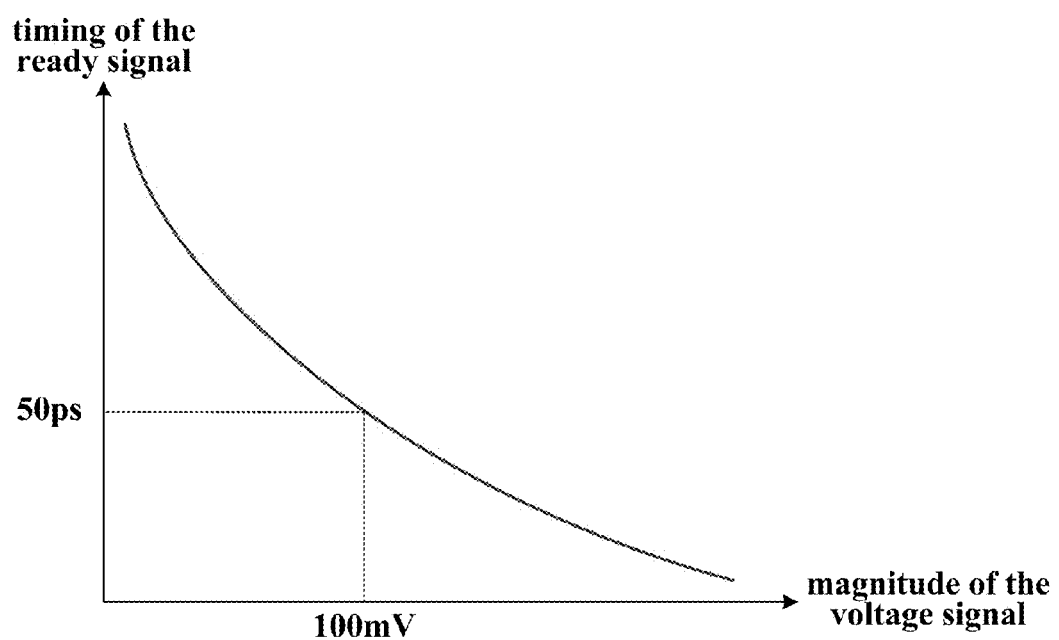
FIG. 2 shows a transfer function that characterizes how a timing of a ready signal of a comparator relates to a magnitude of a voltage signal that the comparator is resolving.

A comparator (such as CMP 120~123 in FIG. 1) conducts a detection of a polarity of a voltage signal (such as VI, V1, V2, and V3). The detection starts at an edge of a clock signal (such as a rising edge of the clock signal CK in FIG. 1). It takes some time to finish the detection. To indicate whether or not the detection is finished, the comparator outputs a ready signal (such as R0, R1, R2, and R3 in FIG. 1), which remains de-asserted until the detection is finished. The timing of the ready signal, which is defined by the time it takes to finish the detection, i.e. the time lapse between the edge of the clock signal CK and the assertion of the ready signal, depends on a magnitude of the voltage signal. The polarity of a larger voltage signal is easier and takes less time to detect, and therefore the ready signal will be asserted earlier. The timing of the ready signal, therefore, reflects the magnitude of the voltage signal. FIG. 2 shows an exemplary transfer function that characterizes how the timing of the ready signal depends on the magnitude of the voltage signal.

By way of example, when the magnitude of the voltage signal is 100 mV, the timing of the ready signal is 50 ps, i.e., it takes 50 ps for the comparator to resolve the polarity of the voltage signal. For a given voltage signal, if the timing is greater (smaller) than 50 ps, the magnitude of the voltage signal must be smaller (greater) than 100 mV. By concurrently detecting an input voltage and also detecting a reference voltage, we can determine whether the input voltage is greater in magnitude than the reference voltage by comparing the time it takes to detect the input voltage with the time it takes to detect the reference voltage.

Referring again to FIG. 1, by way of example but not limitation, V1 is 100 mV, V2 is 200 mV, and V3 is 300 mV, i.e. VIP, V2P, and V3P are higher than V1N, V2N, and V3N by 100 mV, 200 mV, and 300 mV, respectively. Per what was discussed earlier, the timing of R1 must be greater than the timing of R2, which must be greater than the timing of R3. If the timing of R0 is greater than the timing of R1, it indicates that the magnitude of VI must be smaller than 100 mV. If the timing of R0 is smaller than the timing of R1 but greater than the timing of R2, this indicates that the magnitude of VI must be greater than 100 mV but smaller than 200 mV. If the timing of R0 is smaller than the timing of R2 but greater than the timing of R3, this indicates that the magnitude of VI must be greater than 200 mV but smaller than 300 mV. If the timing of R0 is smaller than the timing of R3, this indicates the magnitude of VI must be greater than 300 mV. Therefore, by comparing the timing of R0 with the timings of R1, R2, and R3, a range of the magnitude of VI can be found. The TDC 130 serves to compare the timing of R0 with the timings of R1, R2, and R3 using DFF 131, 132, and 133, respectively. DFF 131 (132, 133) samples R0 at a rising edge of R1 (R2, R3), resulting in D1 (D2, D3). If the timing of R0 is greater than the timing of R1 (R2, R3), D1 (D2, D3) is 0; if the timing of R0 is smaller than the timing of R1 (R2, R3), D1 (D2, D3) is 1. In addition, P0 indicates the polarity of VI: if R0 is 1 and P0 is 1 (0), it indicates VI is positive (negative). Therefore, the range of VI can be found based on P0, D1, D2, and D3, and the output encoder 140 can establish the output data DOUT to represent VI using the following table:

| P0 | D1 | D2 | D3 | The range of VI | DOUT |
|----|----|----|----|-----------------|------|
| 0 | 1 | 1 | 1 | VI < −300 mV | 0 |
| 0 | 1 | 1 | 0 | −300 mV < VI < −200 mV | 1 |
| 0 | 1 | 0 | 0 | −200 mV < VI < −100 mV | 2 |
| 0 | 0 | 0 | 0 | −100 mV < VI < 0 mV | 3 |
| 1 | 0 | 0 | 0 | 0 mV < VI < 100 mV | 4 |
| 1 | 1 | 0 | 0 | 100 mV < VI < 200 mV | 5 |
| 1 | 1 | 1 | 0 | 200 mV < VI < 300 mV | 6 |
| 1 | 1 | 1 | 1 | 300 mV < VI | 7 |

The ADC 100, therefore, is effectively a 3-bit, 8-level ADC.

The ADC 100 is superior to prior art flash ADC in two aspects. First, a smaller number of comparators are needed. To be more specific, a prior art 3-bit, 8-level flash ADC needs seven comparators, whereas the ADC 100 only needs four comparators. Second, the input voltage VI does not need to be compared with a plurality of reference voltages, therefore the loading to the source device that outputs the input voltage VI can be much smaller, compared to the case of prior art flash ADC.

DFF is well known to those of ordinary skill in the art and thus not described in detail here.

Figure 3:
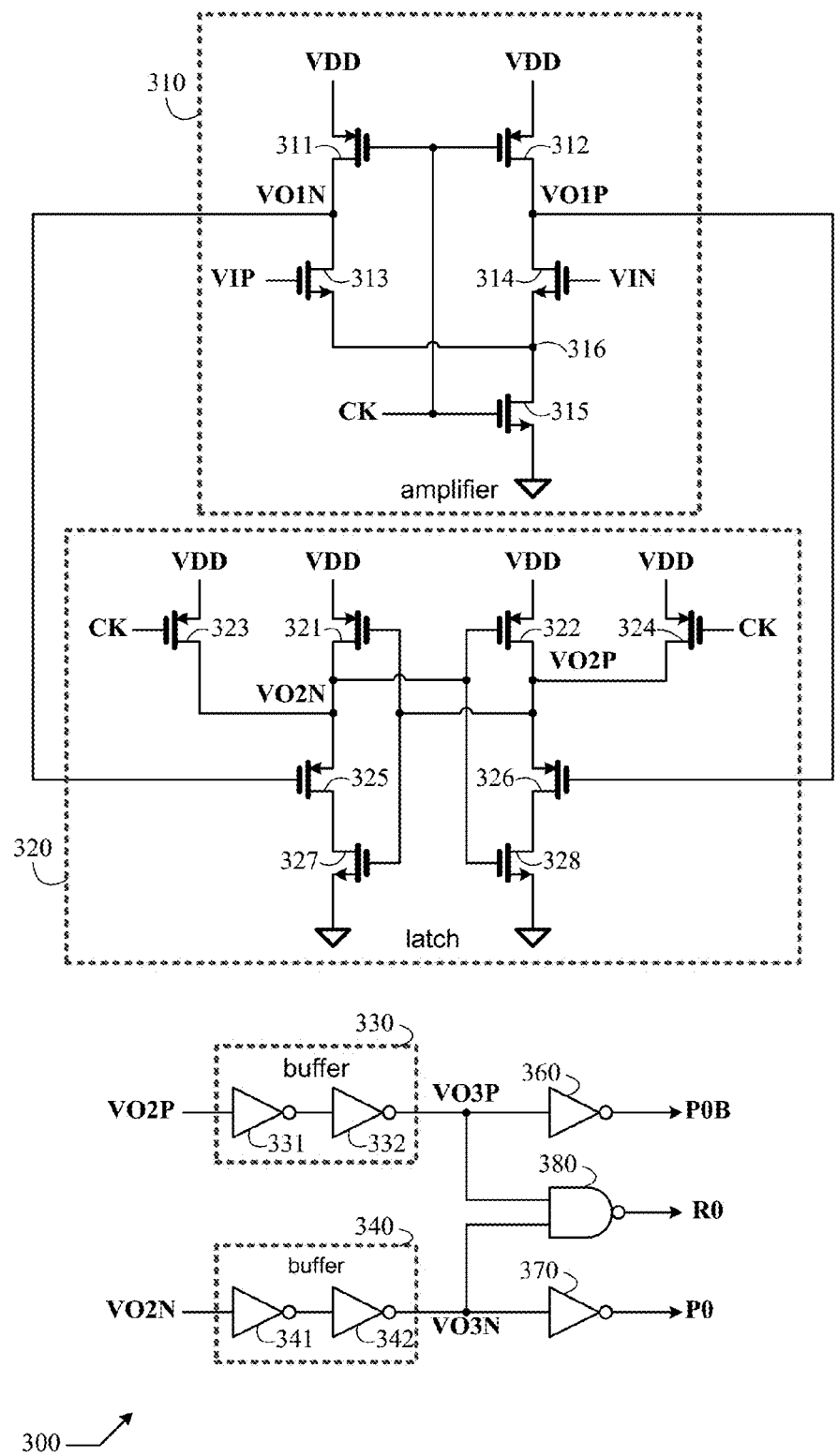
FIG. 3 shows a schematic diagram of a comparator in accordance with an embodiment of the present invention.

FIG. 3 shows a schematic diagram of a comparator 300 that is an embodiment for comparator 120 of FIG. 1. Comparator 300 comprises: an amplifier 310 configured to receive the input voltage VI (which comprises a first end VIP and a second end VIN) and output a first intermediate voltage VO1 (which comprises a first end VO1P and a second end VO1N); a latch 320 configured to receive the first intermediate voltage VO1 and output a second intermediate voltage VO2 (which comprises a first end VO2P and a second end VO2N); a pair of buffers 330 and 340 configured to receive the second intermediate voltage VO2 and output and output a third intermediate voltage VO3 (which comprises a first end VO3P and a second end VO3N); a first pair of inverters 360 and 370 configured to receive the third intermediate voltage VO3 and output P0B and P0, respectively, wherein P0 is the aforementioned first polarity signal indicating the polarity of the input voltage VI, and P0B is a logical complement to P0 when P0 is ready (i.e. R0 is high); and a NAND gate 380 configured to receive VOP3 and VON3 and output R0, which is the aforementioned first ready signal. Throughout this disclosure, "VDD" denotes a power supply node. The amplifier 310 comprises: PMOS (p-channel metal oxide semiconductor) transistors 311 and 312, and NMOS (n-channel metal oxide semiconductor) transistors 313, 314, and 315. The latch 320 comprises: PMOS transistors 321, 322, 323, 324, 325, and 326, and NMOS transistors 327 and 328. Buffer 330 comprises a second pair of inverters 331 and 332 configured in a cascade topology. Buffer 340 comprises a third pair of inverters 341 and 342 configured in a cascade topology. Details of the inter-connection of devices and signals in FIG. 3 are self-explanatory and clear to those of ordinary skill in the art and thus not explained here (e.g., the source, the gate, and the drain terminals of PMOS transistor 311 are connected to VDD, CK, and VO1N, respectively; the source, the gate, and the drain terminals of NMOS transistor 313 are connected to circuit node 316, VIP, and VO1N, respectively).

When the clock signal CK is low: NMOS transistor 315 is turned off, causing NMOS transistors 313 and 314 to be turned off, and consequently VO1P and VO1N are pulled high to VDD via PMOS transistors 312 and 311, respectively. As a result, PMOS transistors 325 and 326 are turned off, VO2N and VO2P are pulled high to VDD via PMOS transistors 323 and 324, respectively, causing VOP3 and VON3 to be pulled high via buffers 330 and 340, respectively, and as a result P0, P0B, and R0 are all pulled low. When the clock signal CK turns high: PMOS transistors 311, 312, 323, and 324 are all turned off, NMOS transistors 313, 314, and 315 are all turned on, and both VO1P and VO1N falls down toward ground. If VIP (VIN) is higher than VIN (VIP), VO1N (VO1P) falls down faster than VO1P (VO1N), causing VO2N (VO2P) to fall down faster than VO2P (VO2N). As a result, VO2N (VO2P) falls to ground, causing VO2P (VO2N) to be pulled high to VDD via PMOS transistor 322 (321). Consequently, VO3P (VO3N) stays high, VO3N (VO3P) falls to low via the buffer 340 (330), P0 (P0B) is asserted via inverter 370, and R0 is asserted via the NAND gate 380, indicating P0 is ready, since a detection of the polarity of VI is finished. Inverters (such as 331, 332, 341, 342, 360, and 370) and NAND gate (such as 380) are well known to those of ordinary skill in the art and thus not described in detail here.

When comparator 300 of FIG. 3 is used to embody comparator 120 of FIG. 2, the same circuit is also used to embody comparators 121 (122, 123) by simply replacing VI with V1 (V2, V3), replacing P0 with P1 (P2, P3), and replacing R0 with R1 (R2, R3), respectively.

Figure 4:
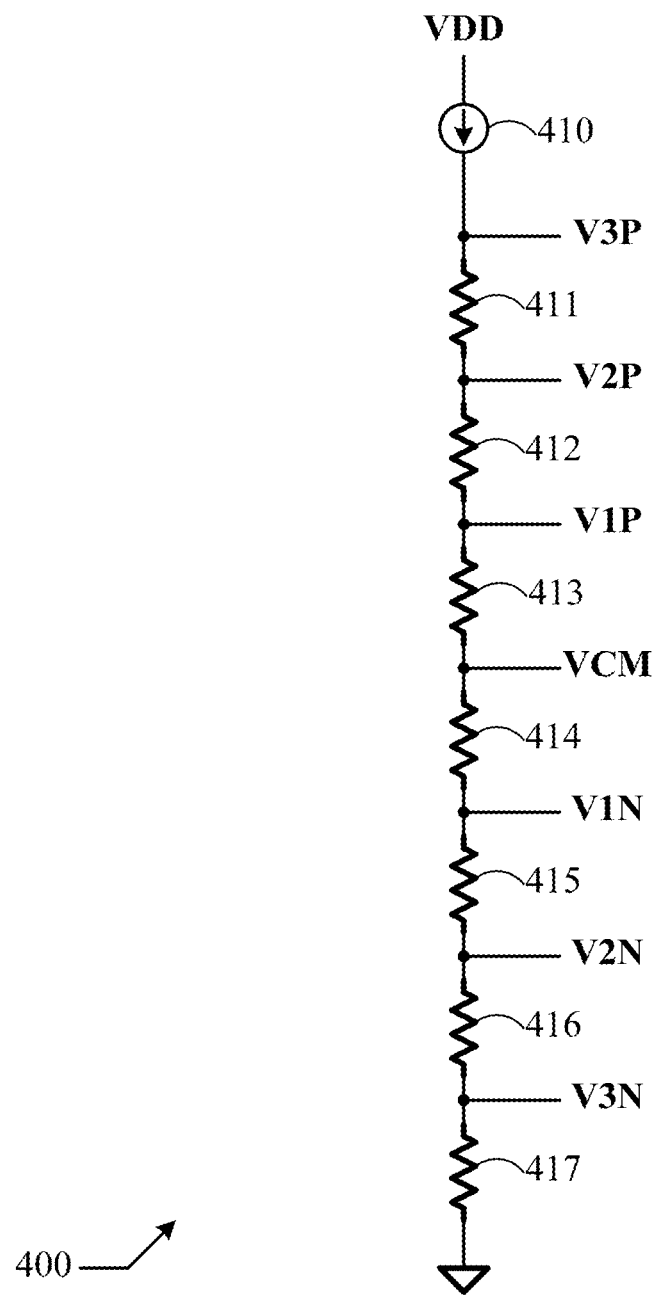
FIG. 4 shows a schematic diagram of a resistive ladder in accordance with an embodiment of the present invention.

The reference voltages V1, V2, and V3 can be generated using for instance a resistive ladder 400 shown in FIG. 4. Resistive latter 400 comprises a current source 410 and by way of example but not limitation seven resistors 411~417. FIG. 4 is self-explanatory to those of ordinary skill in the art (for instance, V2P is taken between resistors 411 and 412) and thus not explained in detail here. By way of example but not limitation, resistors 411~417 are all 50-ohm resistors, and the current of the current source 410 is 100 μA; this makes V1 (which is the voltage difference between V1P and V1N) 100 mV, V2 (which is the voltage difference between V2P and V2N) 200 mV, and V3 (which is the voltage difference between V3P and V3N) 300 mV. In addition, there is a common-voltage voltage VCM taken between resistors 413 and 414, which is a mean value of V1P and V1N, and also a mean value of V2P and V2N, and also a mean value of V3P and V3N. For ADC 100 of FIG. 1 to function well, the common-mode value of the input voltage VI (which is a mean value of VIP and VIN) must be equal to the common-mode voltage VCM, if the resistive ladder 400 is used to generate the reference voltages V1, V2, and V3. The common-mode value of the input voltage VI can be set by the source circuit that outputs the input voltage VI, for instance by using a common-mode feedback scheme. Common-mode feedback is well known to those of ordinary skill in the art and thus not described in detail here.

With continued reference to FIG. 1, note that what is shown within the TDC 130 is only an exemplary embodiment of a time-to-digital converter. Other embodiments can be used, as long as the resultant digital signal D reflects a relative timing of R0 with respect to R1, R2, and R3.

Note that R0 (R1, R2, R3) is a timing signal that is asserted at a time when comparator 120 (121, 122, 123) finishes detecting the polarity of VI (V1, V2, V3). The TDC 130 receives timing signals R0, R1, R2, and R3 and outputs the digital signal D and therefore fulfills a time-to-digital conversion function.

Those skilled in the art will readily observe that numerous modifications and alterations of the device and method may be made while retaining the teachings of the invention. Accordingly, the above disclosure should be construed as limited only by the metes and bounds of the claims.

What is claimed is:

1. A circuit comprising:
   a comparator array comprising a first comparator configured to receive an input voltage and output a first polarity signal indicating a polarity of the input voltage along with a first ready signal indicating the first polarity signal is ready in accordance with a timing of a clock signal, and a second comparator configured to receive a first reference voltage and output a second polarity signal indicating a polarity of the first reference voltage along with a second ready signal indicating the second polarity signal is ready in accordance with the timing of the clock signal;
   a time-to-digital converter configured to receive the first ready signal and the second ready signal and output a digital signal indicating a relative timing between the first ready signal and the second ready signal; and
   an output encoder configured to receive the first polarity signal and the digital signal and output an output data representing an analog-to-digital conversion of the input voltage.

2. The circuit of claim 1, wherein: the comparator array further comprises a third comparator configured to receive a second reference voltage and output a third polarity signal indicating a polarity of the second reference voltage along with a third ready signal indicating the third polarity signal is ready in accordance with the timing of the clock signal; the time-to-digital converter is configured to further receive the third ready signal; and the digital signal further indicates a relative timing between the first ready signal and the third ready signal.

3. The circuit of claim 2, wherein the time-to-digital converter comprises a first flip-flop circuit configured to detect a relative timing of the first ready signal with respect to the second ready signal.

4. The circuit of claim 3, wherein the time-to-digital converter further comprises a second flip-flop circuit configured to detect a relative timing of the first ready signal with respect to the third ready signal.

5. The circuit of claim 2, wherein the first reference voltage is established by using a resistive ladder.

6. The circuit of claim 2, wherein a common-mode value of the input voltage is the same as a common-mode value of the first reference voltage and also the same as a common-mode value of the second reference voltage.

7. The circuit of claim 2, wherein a magnitude of the second reference voltage is twice as large as a magnitude of the first reference voltage.

8. A circuit comprising:
   an input comparator configured to receive an input voltage and output an input-dependent polarity signal along with an input-dependent ready signal;
   N reference comparators configured to receive N reference voltages and output N reference-dependent polarity signals along with N reference-dependent ready signals, respectively, wherein N is an integer greater than one;
   a time-to-digital converter configured to receive the input-dependent ready signal and the N reference-dependent ready signals and output a digital signal quantifying a relative timing of the input-dependent ready signal with respect to the N reference-dependent ready signals; and
   an output encoder configured to receive the input-dependent polarity signal and the digital signal and output an output data representing an analog-to-digital conversion of the input voltage, wherein: the input-dependent ready signal is asserted when the input comparator finishes a detection of a polarity of the input voltage, and each of the N reference-dependent ready signal is asserted when a respective reference comparator finishes a detection of a polarity of a respective reference voltage.

9. The circuit of claim 8, wherein N reference comparators are constructed by substantially identical circuits.

10. The circuit of claim 9, wherein the input voltage and the N reference voltages all have the same common-mode value.

11. The circuit of claim 10, wherein the time-to-digital converters comprises N flip-flop circuits configured to detect a relative timing between the input-dependent ready signal and the N reference-dependent ready signals, respectively.

12. The circuit of claim 11, wherein the digital signal comprises N logical signals output from the N flip-flop circuits, respectively.

13. The circuit of claim 12, wherein the N reference voltages are uniformly spaced in levels.

14. The circuit of claim 13, wherein the N reference voltages are established using a resistive ladder.

15. A method comprising:
  receiving an input voltage and a plurality of reference voltages comprising at least a first reference voltage and a second reference voltage;
  concurrently detecting the input voltage using an input comparator and detecting said plurality of reference voltages using a plurality of reference comparators comprising at least a first reference comparator and a second reference comparator, respectively, wherein the first input comparator outputs an input-dependent timing signal and said plurality of reference comparators output a plurality of reference-dependent timing signals comprising at least a first reference-dependent timing signal and a second reference-dependent timing signal, respectively;
  conducting a time-to-digital conversion to detect a relative timing between the input-dependent timing signal and said plurality of reference-dependent timing signals;
  determining a polarity of the input voltage based on a result of detecting the input voltage; and
  determining a range of the input voltage based on a result of the time-to-digital conversion.

16. The method of claim 15, wherein the input comparator detects a polarity of the input voltage and asserts the input-dependent timing signal upon a time when the polarity of the input voltage is resolved, the first reference comparator detects a polarity of the first reference voltage and asserts the first reference-dependent timing signal upon a time when the polarity of the first reference voltage is resolved, the second reference comparator detects a polarity of the second reference voltage and asserts the second reference-dependent timing signal upon a time when the polarity of the second reference voltage is resolved, and so on.

17. The method of claim 15, wherein the input comparator and said plurality of reference comparators are constructed by substantially the same circuits.

18. The method of claim 15, wherein the input voltage and said plurality of reference voltages all have the same common-mode value.

19. The method of claim 15, wherein said plurality of reference voltages are established using a resistive ladder.

20. The method of claim 15, wherein conducting a time-to-digital conversion comprises using a plurality of flip-flop circuits configured to detect a relative timing between the input-dependent timing signal and said plurality of reference-dependent timing signals, respectively.

* * * * *